(12) United States Patent
Chen et al.

(10) Patent No.: US 9,520,284 B1
(45) Date of Patent: Dec. 13, 2016

(54) ION BEAM ACTIVATED DIRECTIONAL DEPOSITION

(71) Applicant: Varian Semiconductor Equipment Associates, Inc., Gloucester, MA (US)

(72) Inventors: Tsung-Liang Chen, Danvers, MA (US); Mark Saly, Santa Clara, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/940,980

(22) Filed: Nov. 13, 2015

(51) Int. Cl.
*H01L 21/02* (2006.01)

(52) U.S. Cl.
CPC ....... *H01L 21/0228* (2013.01); *H01L 21/0217* (2013.01); *H01L 21/02321* (2013.01); *H01L 21/02362* (2013.01)

(58) Field of Classification Search
CPC .... C23C 16/345; C23C 16/401; C23C 16/452; H01L 21/28088; H01L 21/02164; H01L 21/0217; H01L 21/02274; H01L 21/0228; H01L 21/02362; H01L 21/02321
USPC ....................................... 438/766
See application file for complete search history.

(56) References Cited

U.S. PATENT DOCUMENTS

| | | | | |
|---|---|---|---|---|
| 6,703,307 | B2 * | 3/2004 | Lopatin | H01L 21/76846 438/553 |
| 2010/0041243 | A1 * | 2/2010 | Cheng | C23C 16/345 438/778 |
| 2012/0009802 | A1 * | 1/2012 | LaVoie | C23C 16/045 438/783 |

* cited by examiner

*Primary Examiner* — Caleen Sullivan

(57) ABSTRACT

Approaches herein provide precise areal surface reaction with directional ion beam activation. Exemplary approaches include selectively forming a material within a trench of a semiconductor device using a plurality of successive deposition and activation cycles. Each of the plurality of deposition and activation cycles includes forming a precursor conformally along a set of surfaces of the trench, reacting the precursor with a capping compound to form a capping layer along the set of surfaces of the trench, and performing an ion implant to the semiconductor device to activate just a portion of the capping layer. In one approach, the ion implant activates just a portion of the capping layer along a bottom surface of the trench. In another approach, the ion implant activates just a portion of the capping layer along an upper section of a sidewall of the trench.

19 Claims, 6 Drawing Sheets

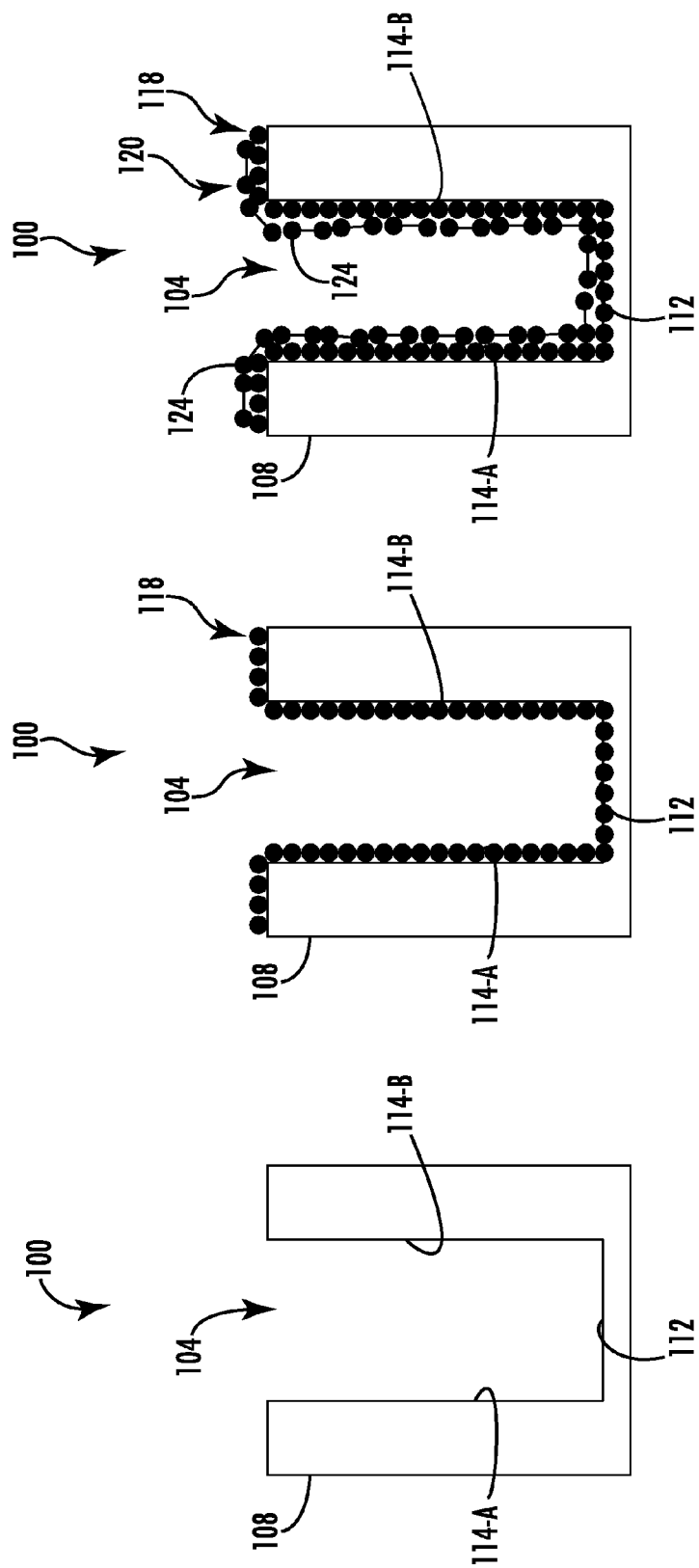

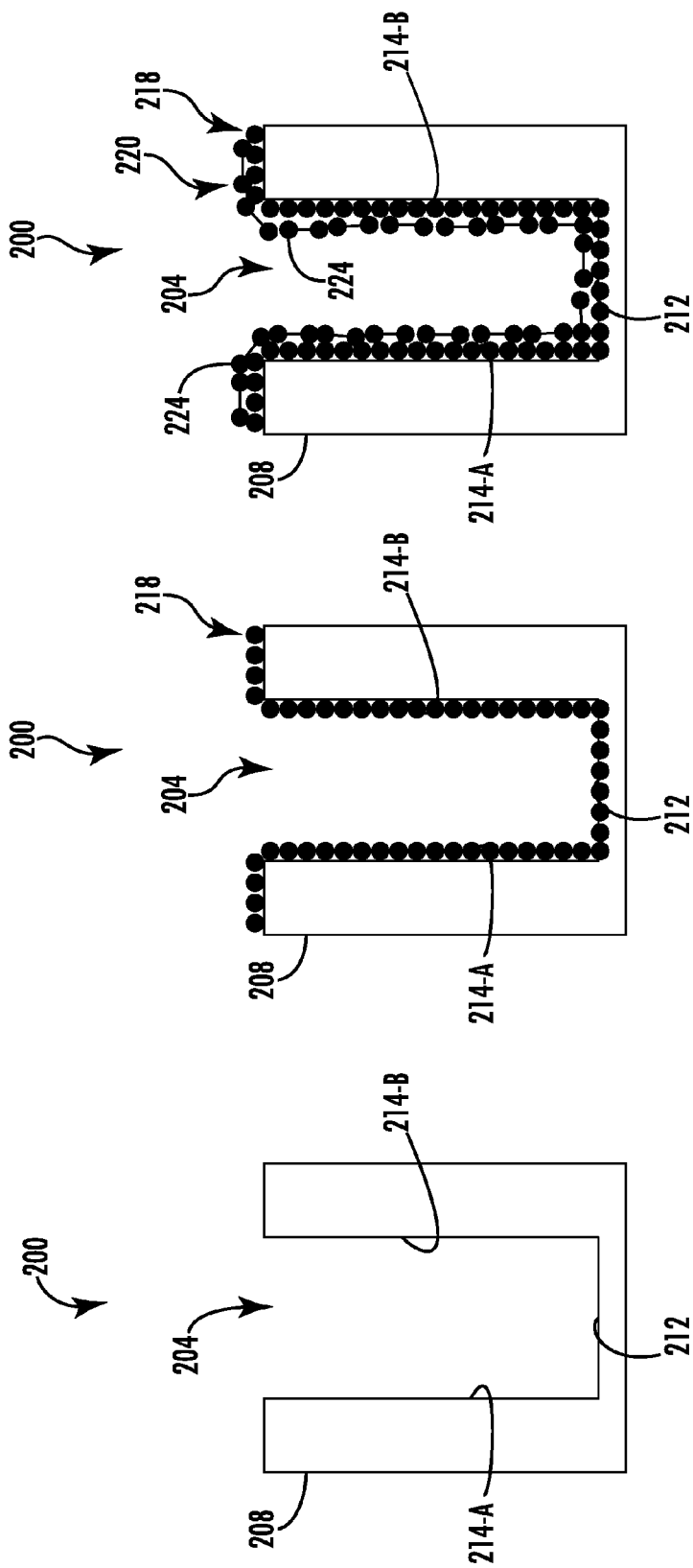

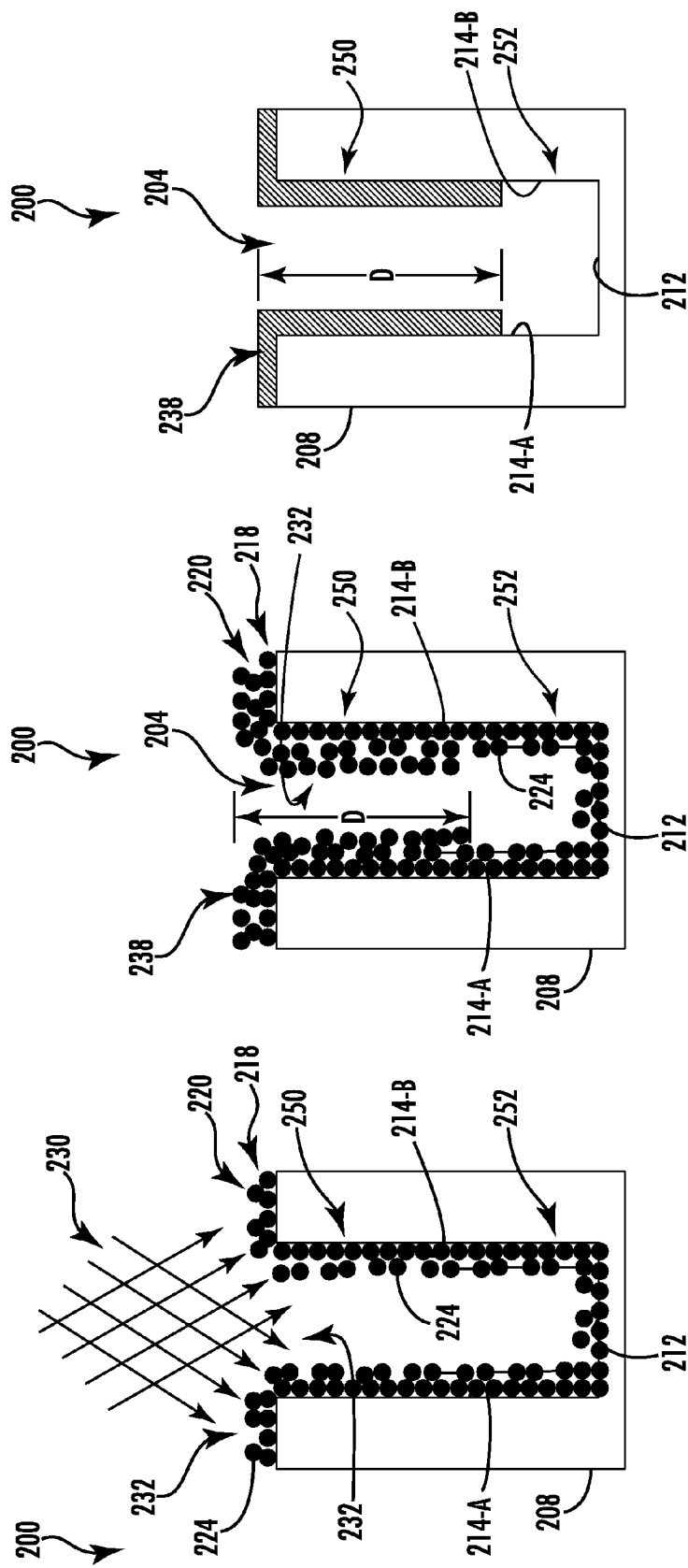

ION BEAM ACTIVATED DIRECTIONAL DEPOSITION

FIELD OF THE DISCLOSURE

The present embodiments relate to substrate patterning, and more particularly, to techniques for directed layer deposition using ion beam activation.

BACKGROUND OF THE DISCLOSURE

As semiconductor devices scale to smaller dimensions, a need has arisen to more accurately define and control the dimensions and shapes of photoresist (resist) features used to pattern substrates. Conformal, uniform dielectric films have many applications in semiconductor manufacturing. In the fabrication of sub-micron integrated circuits (ICs) several layers of dielectric film are deposited. For example, four such layers are shallow trench isolation (STI), pre-metal dielectric (PMD), inter-metal dielectric (IMD) and interlayer dielectric (ILD). All four of these layers require silicon dioxide films filling features of various sizes and have uniform film thicknesses across the wafer.

Applications such as self-aligned doping may include a top part of an IC trench capped with a hardmask so just the bottom part of the fin is exposed to the dopant source. Another application may include a gap fill requiring bottom up film deposition to achieve void/seam free trench isolation.

Chemical vapor deposition (CVD) is one method for depositing silicon dioxide films. However, as design rules continue to shrink, the aspect ratios (depth to width) of features increase, and traditional CVD techniques can no longer provide void-free gap-fill in these high aspect ratio features. An alternative to CVD is atomic layer deposition (ALD). ALD methods involve self-limiting adsorption of reactant gases and can provide thin, conformal dielectric films within high aspect ratio features. An ALD-based dielectric deposition technique may involve adsorbing a metal containing precursor onto the substrate surface, then, in a second procedure, introducing a silicon oxide precursor gas.

However, current thin film deposition methods lack adequate control over where the deposition happens. For processes such as LPCVD (low pressure CVD) and ALD, the film deposition is conformal. LPCVD relies on thermal reaction on the surface, while ALD give layer by layer process through sequential chemical exposure. For plasma enhanced chemical vapor deposition (PECVD) processes, the deposition may result in a "bread-loaf" shape due to the ion-induced deposition.

In some approaches, ALD relies on alternate pulsing of the precursor gases onto the substrate surface and subsequent surface reaction of the precursors. ALD can also be achieved under plasma environment (PEALD) as the surface is exposed to the active species generated by plasma during the reactant process. However, typical ALD chemistry is self-limiting with no areal selectivity, the areal selectivity giving conformal behavior of the deposition. Furthermore, plasma ions effect film property modification, but have no control on the surface reaction.

SUMMARY OF THE DISCLOSURE

In view of the foregoing, approaches herein provide precise areal surface reaction with directional ion beam activation, applicable to various applications and materials.

An exemplary method in accordance with the present disclosure may include exposing a trench of a semiconductor device to a first precursor, and forming a capping layer along a set of surfaces of the trench by reacting the precursor with a capping compound. The method further includes performing an ion implant to the semiconductor device to activate a portion of the capping layer, and exposing the trench to a second precursor.

Another exemplary method in accordance with the present disclosure may include selectively growing a trench material within a trench of a semiconductor device using a plurality of successive cycles, each of the plurality of successive cycles including chemisorbing a precursor along a set of surfaces of the trench, reacting the precursor with a capping compound to form a capping layer along the set of surfaces of the trench, and performing an ion implant to the semiconductor device to activate just a portion of the capping layer.

Another exemplary method in accordance with the present disclosure may include selectively growing a trench-fill material within a trench of a semiconductor device by performing a plurality of successive cycles, each of the plurality of successive cycles including chemisorbing a precursor conformally along a set of surfaces of the trench, reacting the precursor with a capping compound to form a capping layer along the set of surfaces of the trench, and performing an ion implant to the semiconductor device to activate just a portion of the capping layer.

BRIEF DESCRIPTION OF THE DRAWINGS

FIGS. 1A-F depict side cross-sectional views of a method for forming material within a trench of a semiconductor device in accordance with an embodiment of the present disclosure.

FIGS. 2A-2F depict side cross-sectional views of a method for forming material within a trench of a semiconductor device in accordance with an embodiment of the present disclosure.

Figure 1F:
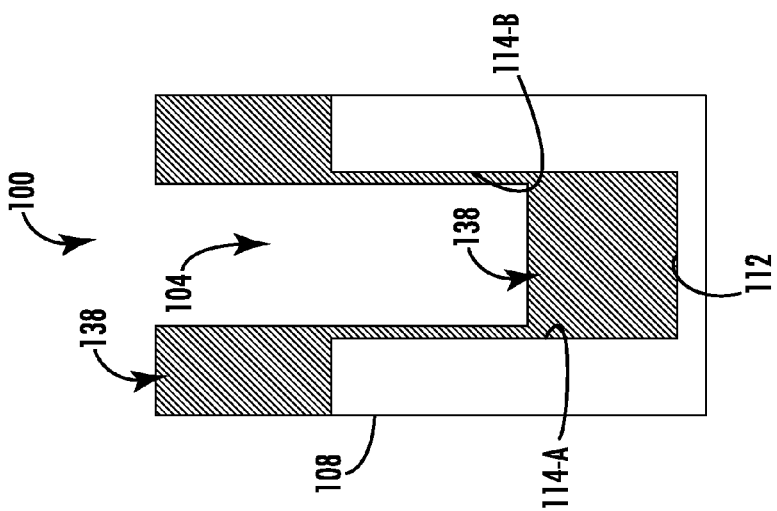
Figure 1E:
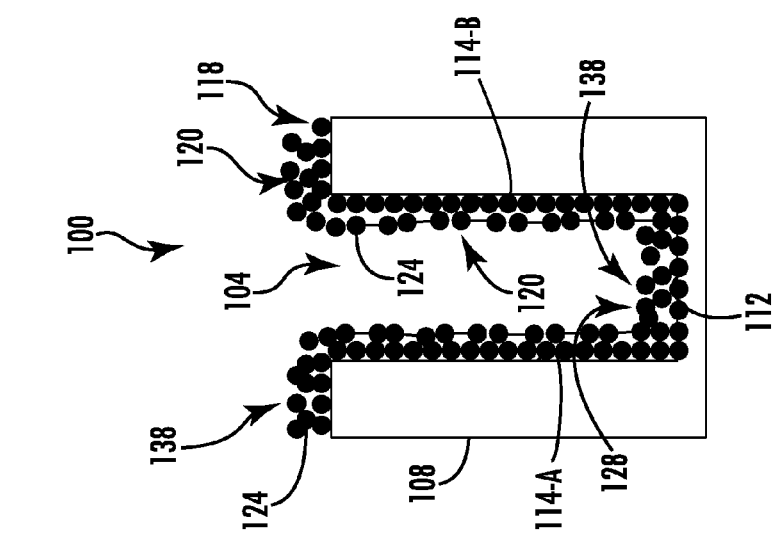

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The methods may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described, approaches herein provide precise areal surface reaction with directional ion beam activation. Exemplary approaches include selectively forming a material within a trench of a semiconductor device using a plurality of successive deposition and activation cycles (e.g., an ALD process). Each of the plurality of deposition and activation cycles includes forming a precursor conformally along a set of surfaces of the trench, reacting the precursor with a capping compound to form a capping layer along the set of surfaces of the trench, and performing an ion implant to the semiconductor device to activate just a portion of the capping layer. In one approach, the ion implant activates just a portion of the capping layer along a bottom surface of the trench. In another approach, the ion implant activates just a portion of the capping layer along a portion of a sidewall of the trench.

As used herein, the term "atomic layer deposition" or "ALD" may refer to a vapor deposition process whereby deposition cycles, preferably a plurality of consecutive deposition cycles, are conducted in a process chamber (i.e., a deposition chamber). During each cycle, the precursor may be chemisorbed to a deposition surface (e.g., a substrate assembly surface or a previously deposited underlying surface such as material from a previous ALD cycle), forming a monolayer or sub-monolayer not readily reacting with additional precursor (i.e., a self-limiting reaction). Thereafter, a reactant (e.g., another precursor or reaction gas) may be introduced into the process chamber for use in converting the chemisorbed precursor to the desired material on the deposition surface. Typically, this reactant is capable of reaction with the already chemisorbed precursor. Additionally, purging processess may also be utilized, as necessary, during each cycle to remove excess precursor from the process chamber and/or remove excess reactant and/or reaction by-products from the process chamber after conversion of the chemisorbed precursor.

As compared to the one process CVD process, the longer duration multi-cycle ALD process provides improved control of layer thickness and composition by self-limiting layer growth, and minimizes detrimental gas phase reactions by separation of the reaction components. The self-limiting nature of ALD provides a method of depositing a film on a wide variety of reactive surfaces, including surfaces with irregular topographies, with better step coverage than is available with CVD or with other "line of sight" deposition methods such as evaporation or physical vapor deposition (PVD or sputtering). As will be described in further detail below, the ALD process is further enhanced using directional ion beam activation.

Turning now to FIGS. 1A-1F there is shown a series of cross-sectional views of an approach for forming a device 100 (e.g., a semiconductor device) according to various embodiments of the disclosure. FIG. 1A depicts a patterning feature such as a trench 104 formed within a substrate 108 of the device 100. As shown, the trench 104 includes a set of surfaces, such a bottom surface 112 and a set of sidewall surfaces 114A-B. In various embodiments, the trench 104 may form part of a larger pattern of features disposed on a silicon wafer or other substrate. Accordingly, the trench 104 may be characteristic of many other similar features formed within the substrate 108, such as millions of other similar features.

In some embodiments, the device 100 represents a structure after an anisotropic etch is performed, e.g., to etch a sacrificial material, a tunnel oxide, and a wafer. Subsequently, a resist is removed to result in the structure of FIG. 1A, depicting the trench 104 (e.g., an isolation trench). In a non-limiting embodiment, with current processing techniques and for illustration purposes, the trench 104 within the semiconductor wafer (i.e. not including the tunnel oxide and the sacrificial material) may be about 400 Å (±100 Å) or less wide at the top and may have an aspect ratio of between about 5:1 (i.e. a depth about five time the width) to about 8:1. Thus the trench 104 may be between about 2,400 Å and about 4,000 Å deep to achieve an aspect ratio of between 5:1 and 8:1 for a 400 Å wide opening.

As shown in FIG. 1B, the trench 104 is exposed to a precursor 118 introduced to the device 100. The precursor 118 may be conformally disposed along the set of surfaces 112 and 114A-B of the trench 104. In one embodiment, the precursor 118 may be a reactive precursor chemisorbed to the surfaces of the device 100, including within the trench 104. In various non-limiting embodiments, the precursor 118 may include oxygen or silicon-containing precursors such as molecular oxygen ($O_2$) and/or ozone ($O_3$), tetraethyl orthosilicate (TEOS) octamethyltrisiloxane (OMTS), octamethylcyclotetrasiloxane (OMCTS), methyldiethoxysilane (MDEOS), bis(tertiary-butylamino)silane (BTBAS), tridimethylaminosilane (TriDMAS), trisdimethylaminosilane (TrisDMAS), silane, disilane, dichlorosilane, trichlorosilane, dibromosilane, silicon tetrachloride, silicon tetrabromide, dimethylsilane, trimethylsilane, tetramethylsilane, diethylsilane, tetramethylorthosilicate (TMOS), or combinations thereof. In an exemplary embodiment, the precursor 118 is silicon tetrabromide (SiBr4), chemisorbed to form terminal SiBr3 groups.

The precursor 118 may be a precursor application introduced into a reactor in vapor form, for example, produced by vaporizing a liquid precursor solution through a conventional vaporization process such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas can also remove any dissolved oxygen present in the precursor solution. In other alternatives, the precursor is introduced into the reactor via liquid injection or an aerosol-assisted bubbler.

As shown in FIG. 1C, a capping layer 120 is subsequently formed along the set of surfaces 112 and 114A-B of the trench 104 by reacting the precursor 118 with a capping compound 124, depicted here as a plurality of linked spheres for the purpose of demonstration. The capping compound may be a reactant (e.g., a reaction gas) introduced into the process chamber for use in converting the chemisorbed precursor 118 to the desired material on the deposition surface. Typically, the reactant is capable of reaction with the already chemisorbed precursor 118. In an exemplary embodiment, the capping compound 124 is ethylenediamine, the NH groups reacting with bromine of the precursor 118 to evolve HBr and form Si—NHCH2CH2NH—Si linkages. Thus, capping the surface of the device 100 prevents further thermal ALD growth. In exemplary embodiments, the capping layer 120 is configured to be relatively unreactive to thermal ALD and/or to low energy radical-based ALD, and reactive to high energy ions for breaking up a capping molecule of the capping compound 124.

Figure 1D:
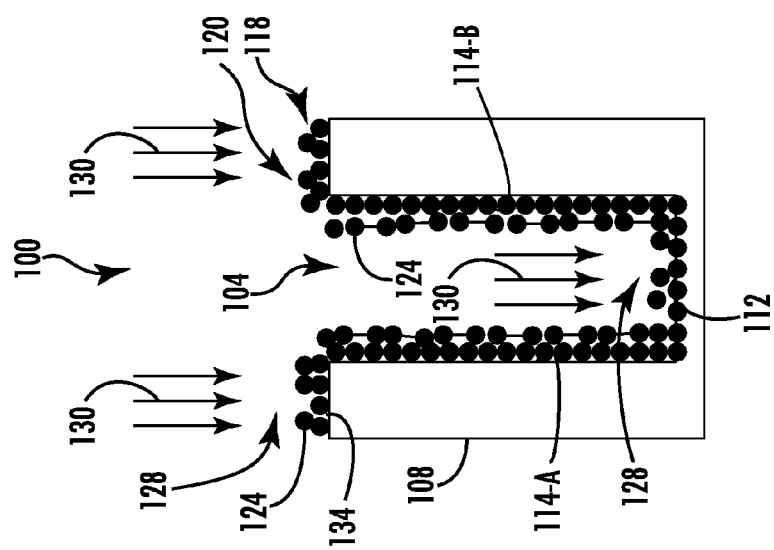

As shown in FIG. 1D, an ion implantation 130 is next performed to the device 100 to activate a portion or portion 128 of the capping layer 120. In one embodiment, the portion 128 represents a section of the capping layer 120 along a top surface 134 of the semiconductor device 100 and the bottom surface 112 of the trench 104. The ion implantation 130 causes ions to be implanted into the portion 128 at an angle perpendicular or substantially perpendicular to the bottom surface 112 of the trench. In one embodiment, the ion implantation 130 may be implemented in a PEALD chamber, wherein direct plasma provides an ion direction perpendicular to the sample (e.g., a substrate or wafer). The capping compound 124 may be introduced through a showerhead within the PEALD chamber.

In an exemplary embodiment, the ion implantation 130 is a highly directional Ar ion treatment performed to reactivate intended surfaces of the device 100 by breaking up the C—C bonds, thus creating reactive sites. As a result, SiBr4 exposed to the surface will react with the activated surfaces (tops and bottoms) to terminate the tops and bottoms with Si—Br groups. This enables a layer of trench material 138 (e.g., silicon nitride (SiN)) to be formed along the activated portions 128 of the capping layer 120, resulting in the structure shown in FIG. 1E. Performing multiple cycles of the sequence depicted by FIGS. 1A-E may result in the structure shown in FIG. 1F. For example, the trench material 138 is selectively grown within the trench 104 and atop the top surface 134 of the device 100 using a plurality of successive deposition, activation, and ion implantation cycles. This provides the advantage of precise/specific atomic level thickness control in just those intended areas.

Turning now to FIGS. 2A-F there is shown a series of cross-sectional views of another approach for forming a device 200 (e.g., a semiconductor device) according to various embodiments of the disclosure. FIG. 2A depicts a patterning feature such as a trench 204 formed within a substrate 208 of the device 200. As shown, the trench includes a set of surfaces, such a bottom surface 212 and a set of sidewall surfaces 214A-B. In some embodiments, the device 200 represents a structure after an anisotropic etch is performed to etch a sacrificial material, a tunnel oxide, and a wafer. Subsequently, a resist is removed to result in the structure of FIG. 2A, depicting the trench 204 (e.g., an isolation trench). In a non-limiting embodiment, with current processing techniques and for illustration purposes, the trench 204 within the semiconductor wafer (i.e. not including the tunnel oxide and the sacrificial material) may be about 400 Å (±100 Å) or less wide at the top and may have an aspect ratio of between about 5:1 (i.e. a depth about five time the width) to about 8:1. Thus the trench 204 may be between about 2,400 Å and about 4,000 Å deep to achieve an aspect ratio of between 5:1 and 8:1 for a 400 Å wide opening.

As shown in FIG. 2B, the trench 204 is exposed to a precursor 218 introduced to the device 200. The precursor 218 may be conformally disposed along the set of surfaces 212 and 214A-B of the trench 204. In one embodiment, the precursor 218 may be a reactive precursor chemisorbed to the surfaces of the device 200, including within the trench 204. In various non-limiting embodiments, the precursor 218 may include OXYGEN OR SILICON-CONTAINING PRECURSORS SUCH AS MOLECULAR OXYGEN ($O_2$) AND/OR OZONE ($O_3$), tetraethyl orthosilicate (TEOS) octamethyltrisiloxane (OMTS), octamethylcyclotetrasiloxane (OMCTS), methyldiethoxysilane (MDEOS), bis(tertiary-butylamino)silane (BTBAS), tridimethylaminosilane (TriDMAS), trisdimethylaminosilane (TrisDMAS), silane, disilane, dichlorosilane, trichlorosilane, dibromosilane, silicon tetrachloride, silicon tetrabromide, dimethylsilane, trimethylsilane, tetramethylsilane, diethylsilane, tetramethylorthosilicate (TMOS), or combinations thereof. In an exemplary embodiment, the precursor 218 is silicon tetrabromide (SiBr4), chemisorbed to form terminal SiBr3 groups.

The precursor 218 may be a precursor application introduced into a reactor in vapor form, for example, produced by vaporizing a liquid precursor solution through a conventional vaporization process such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas can also remove any dissolved oxygen present in the precursor solution. In other alternatives, the precursor is introduced into the reactor via liquid injection or an aerosol-assisted bubbler.

As shown in FIG. 2C, a capping layer 220 is subsequently formed along the set of surfaces 212 and 214A-B of the trench 204 by reacting the precursor 218 with a capping compound 224. The capping compound 224 may be a reactant (e.g., a reaction gas) introduced into the process chamber for use in converting the chemisorbed precursor 218 to the desired material on the deposition surface. Typically, the reactant is capable of reaction with the already chemisorbed precursor 218. In an exemplary embodiment, the capping compound 224 is ethylenediamine, the NH groups reacting with bromine of the precursor 218 to evolve HBr and form Si—NHCH2CH2NH—Si linkages. Thus, capping the surface of the device 200 prevents further thermal ALD growth. The capping layer 220 is configured to be relatively unreactive to thermal ALD and/or to low energy radical-based ALD, and reactive to high energy ions for breaking up a capping molecule of the capping compound 224.

As shown in FIG. 2D, an ion implantation 230 is performed to the device 200 to activate a portion or subsection 232 of the capping layer 220. In one embodiment, the portion 232 represents an area of the capping layer 220 along an upper section 250 of the sidewall surfaces 214A-B of the trench 204. The ion implantation 230 causes ions to be implanted into the portion 232 at an angle non-perpendicular with the bottom surface 212 of the trench 204 and non-parallel with the sidewall surfaces 214A-B of the trench 204. For example, the ions may be implanted into the sidewall surfaces 214A-B at an angle of 60° relative to a plane normal to the sidewall surfaces 214A-B. One will appreciate the implantation angle may vary in other embodiments by +/−15° relative to the plane normal to the sidewall surfaces 214A-B. In some embodiments, the ions may be implanted into sidewall surfaces 214A-B of the trench 204 at an angle selected to prevent ions from implanting the bottom surface 212 and a bottom portion 252 of the sidewall 214A-B of the trench 204.

In one embodiment, the ion implantation 230 is a highly directional Ar ion treatment performed to reactivate just the upper section 250 of the capping layer 220 by breaking up the C—C bonds creating reactive sites. As a result, SiBr4 exposed to the surface will react with the activated surfaces (tops and bottoms) to terminate the tops and bottoms with Si—Br groups. This enables a layer of trench material 238 (e.g., SiN) to be formed (e.g., grown) along the activated portions 232 of the capping layer 220, resulting in the structure shown in FIG. 2E.

In some embodiments, a cleaning or etch process may be required to remove the initial growth area unaffected by the ion beam exposure of the ion implantation 230. In this example, the process may further include removing the capping layer 220 along the bottom surface 212 of the trench 204 and the bottom portion 252 of the sidewalls 214A-B of the trench 204.

Performing multiple cycles of the sequence depicted by FIGS. 2A-E may result in the structure shown in FIG. 2F. For example, the trench material 238 is selectively grown along the sidewalls 214A-B of the trench 204 using a plurality of successive deposition, activation, and ion implantation cycles, thus providing the advantage of precise/specific atomic level thickness control in just the intended areas.

In various embodiments, the ion implantation 130, 230 demonstrated in FIGS. 1D and 2D, respectively, includes one or multiple exposure processes employed to generate the capping layer. In a one-exposure process, the device is processed by a first species penetrating each photoresist feature to a particular depth or thickness. In a multiple exposure process, the device may be processed by a first species in a first exposure at a first angled implant, and may be processed by a second species penetrating each photoresist feature to a particular depth or thickness. In various embodiments, the first species may be provided as first ions implanted to a first implantation depth, or deep implantation depth, and the second species may be provided as second ions implanted to a second implantation depth, or shallow implantation depth, less than the first implantation depth. Advantageously, for embodiments wherein the first species comprise first ions, the first ions may be implanted at a first implantation depth representing a larger fraction of the height of the photoresist feature. The embodiments are not limited in this context. The term "implantation depth," as used herein, may refer to the range Rp of ions within the photoresist, as known in the art.

In particular embodiments, the ions of the ion implantations 130, 230 may be selected from low-mass ions such as hydrogen ions, helium ions, carbon ions, boron ions, or nitrogen ions. Furthermore, the ion implantation energy and ion dose of the first ions may be selected to modify all or a portion of the device, including generating chain scission within the photoresist feature, generating cross-linking in the photoresist feature, removing hydrogen atoms from the photoresist feature, altering the density of the photoresist feature, or other chemical and/or physical effects.

In other embodiments, the ion implantation 130, 230 may constitute vacuum ultraviolet (VUV) radiation where the VUV radiation wavelength is less than 200 nm. The VUV radiation may be configured to penetrate to a depth representing a large fraction of the device. In other embodiments the ions of the ion implantation 130, 230 may constitute electrons generated, for example, by a plasma also used as a source for ion implantation.

Advantageously, the ion implantation 130, 230 may homogenize the surfaces of the device to form the hardened capping layer. For example, the ion implantation 130, 230 may form a densified shell surrounding the inner portion of device surfaces. In addition, the ion implantation 130, 230 may facilitate polymer reorganization and reflow of the trench.

During operation, the ion implantation 230 shown in FIG. 2D may be performed while the device 200 is in a first position. Following implantation along the sidewall surface 214-A, the device 200 is rotated (e.g., 180 degrees), and the ion implantation 230 may further be performed along the sidewall surface 214-B. In exemplary embodiments, the capping layer 220 is just partially implanted along the sidewall surfaces 214A-B by the ion implantation 230, for example, to a vertical depth 'D', as shown in FIGS. 2E-F. In some embodiments, the sidewall will be partially affected if there is shadowing from adjoining structures (e.g., for angled implant).

Dose of the ion implantation 130, 230 is another factor dictating the extent of the desired effect. In one embodiment, in the case of the beamline ion implanter, the total dose of the implantation is divided into an even number of increments using a low dose per increment. In various embodiments, the ion implantation 130, 230 may comprise relatively lighter ions such as hydrogen or helium ions wherein an ion dose is provided over the range of 1E14-5E15 and at anion implantation energy of 1 keV-20 keV. In other embodiments, the ion implantation may comprises relatively heavier ions such as argon ions or silicon ions, wherein an ion dose is provided over a range of 5E15-3E16 and anion implantation energy of 0.5 keV-3 keV.

Additionally, an ion type of ion implantation 130, 230 further dictates the extent of the desired effect. In various embodiments, the ions may come from a wide range of species such as H, He, Ar, C, N, Si, and Ge. The criteria for selecting one or more ion species to use may include the desired level of sputtering, the target ion penetration depth, and the improvement to etch selectivity. In one embodiment, Ar+ ions are implanted at anion implantation energy of 250 eV.

In various embodiments, the ion implantation 130 and 230 may be provided in a beamline ion implanter, a plasma doping tool (PLAD), a plasma tool having a plasma sheath modifier as known in the art, or other tool capable of providing ions. The embodiments of the disclosure are not limited in this context.

Figure 3:
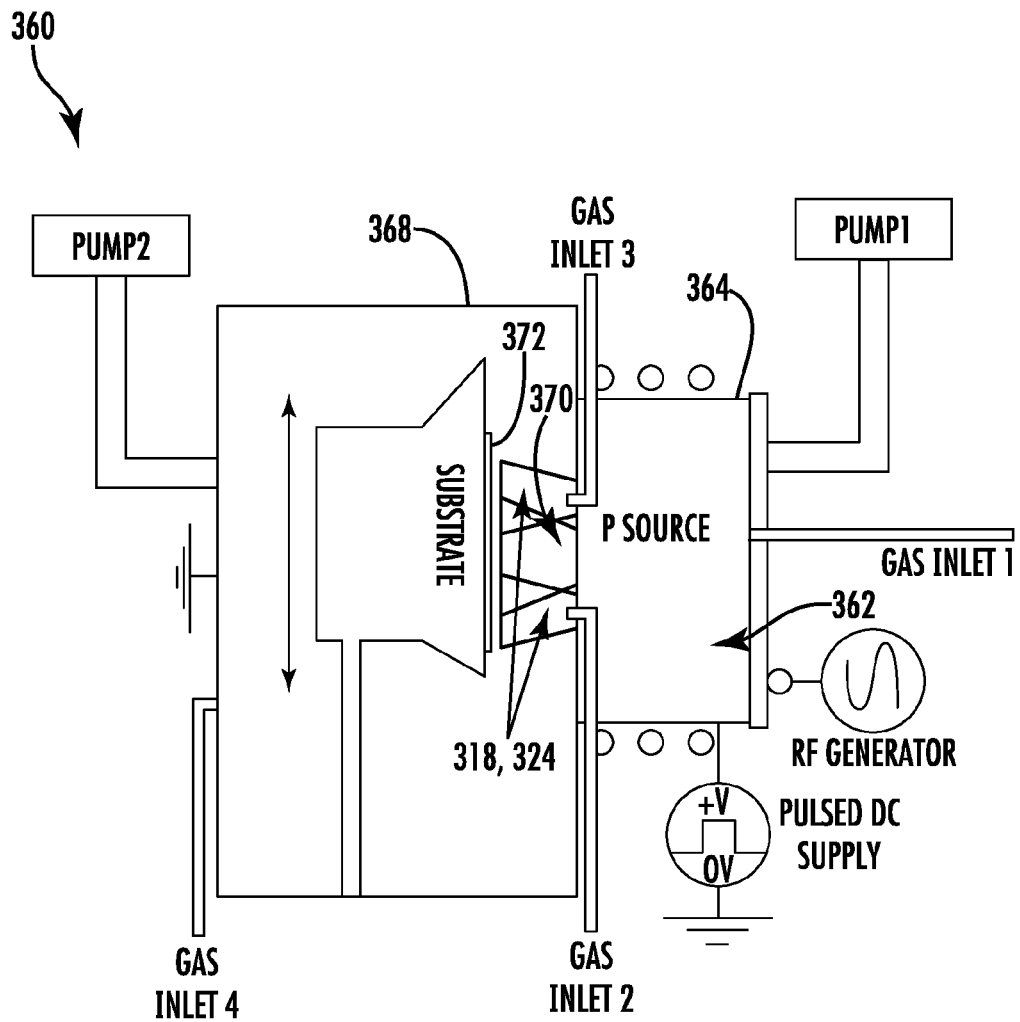
FIG. 3 depicts a system suitable for forming material within a trench of a semiconductor device in accordance with an embodiment of the present disclosure.

One such exemplary implantation system is shown in FIG. 3. In this embodiment, the system 360 includes a gas inlet 1 to introduce a plasma gas 362 to a plasma chamber 364, and gas inlets 2 and 3 for respectively introducing a reactive precursor 318 (e.g., SiBr4) and capping compound/group 324 (e.g., ethylenediamine) to a deposition chamber 368. The reactive precursor 318 and the capping compound 324 may be combined with an ion beam 370 and delivered to a substrate 372. In some embodiments, the exposure of the reaction gas and the ion beam 370 can be done separately. In an exemplary embodiment, the ion beam 370 is generated with inert gas (e.g., He, Ar, etc) introduced by gas inlet 1.

Figure 4:
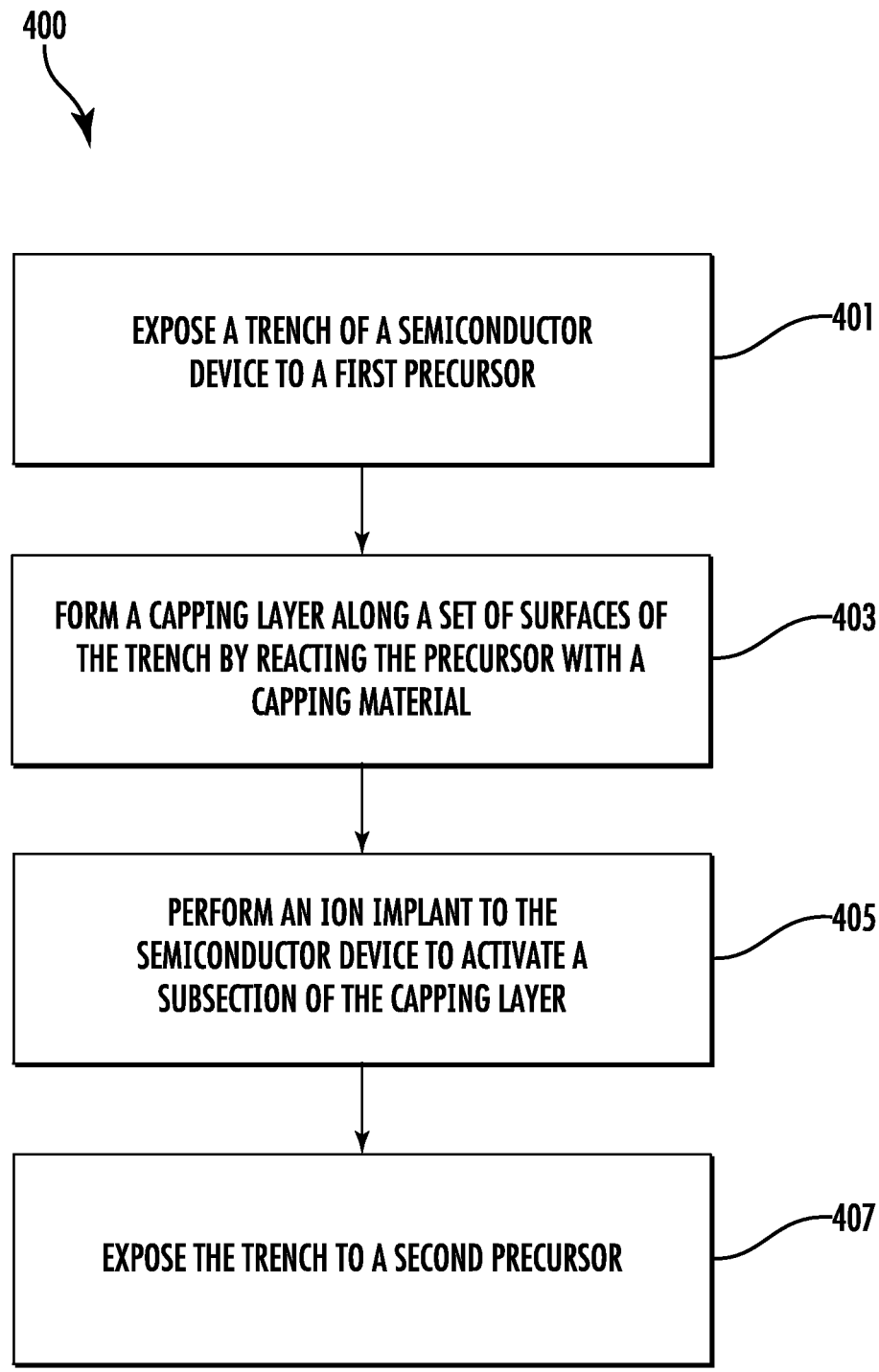
FIG. 4 is a flowchart illustrating an exemplary method according to the present disclosure.

Referring now to FIG. 4, a flow diagram illustrating an exemplary method 400 for patterning a semiconductor device in accordance with the present disclosure is shown. The method 400 will be described in conjunction with the representations shown in FIGS. 1-3.

Method 400 may include exposing a trench of a semiconductor device to a first precursor, as shown in block 401. In some embodiments, the first precursor is chemisorbed along a set of surfaces of the trench. In some embodiments, the first precursor is silicon tetrabromide.

The method 400 may further include forming a capping layer along a set of surfaces of the trench by reacting the precursor with a capping compound, as shown in block 403. In some embodiments, the capping layer is configured to be unreactive to thermal ALD and to low energy radical-based ALD, and reactive to high energy ions for breaking up a capping molecule of the capping compound. In some embodiments, the capping compound is ethylenediamine.

The method 400 may further include performing an ion implant to the semiconductor device to activate a portion of the capping layer, as shown in block 405. In some embodiments, the portion of the capping layer disposed along a bottom surface of the trench and along a top surface of the semiconductor device, and the ions are implanted into the portion of the capping layer is disposed along the bottom surface of the trench at an angle substantially perpendicular to the bottom surface of the trench. In some embodiments, the portion of the capping layer is disposed along an upper portion of a sidewall of the trench, and the ions are implanted into the trench at an angle substantially non-parallel to the sidewall of the trench and non-parallel to the bottom surface of the trench.

The method 400 may further include exposing a trench of a semiconductor device to a second precursor, as shown in block 407. In some embodiments, the second precursor is chemisorbed along a set of surfaces of the trench. In some embodiments, the second precursor is silicon tetrabromide. In some embodiments, blocks 401, 403, and 405 are repeated multiple times to selectively grow a material (e.g., SiN) within the trench.

In view of the foregoing, at least the following advantages are achieved by the embodiments disclosed herein. Firstly, precise areal surface reaction is possible with directional ion beam activation, thus allowing just those intended areas to be implanted with ions generated from the plasma source. Secondly, greater atomic level thickness control is possible by continuously activating the intended portion(s) of the trench within every cycle.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A method comprising:
   exposing a trench of a semiconductor device to a first precursor;
   forming a capping layer along a set of surfaces of the trench by reacting the first precursor with a capping compound;
   performing an ion implant to the semiconductor device to activate a portion of the capping layer by breaking up a capping molecule of the capping compound; and
   exposing the trench to a second precursor.

2. The method according to claim 1, the portion of the capping layer disposed along a bottom surface of the trench.

3. The method according to claim 2, the portion of the capping layer further disposed along a top surface of the semiconductor device.

4. The method according to claim 2, further comprising implanting ions into the portion of the capping layer at an angle substantially perpendicular to the bottom surface.

5. The method according to claim 2, the portion of the capping layer disposed along an upper portion of a sidewall of the trench.

6. The method according to claim 5, further comprising implanting ions into the portion of the capping layer along the upper portion of the sidewall of the trench at an angle substantially non-parallel to the sidewall of the trench and non-parallel to the bottom surface of the trench.

7. The method according to claim 6, further comprising removing the capping layer along the bottom surface of the trench and a bottom portion of the sidewall of the trench.

8. The method according to claim 1, wherein the capping compound is ethylenediamine and the first and second precursor include silicon tetrabromide.

9. The method according to claim 1, wherein the capping layer is configured to be unreactive to a thermal atomic layer deposition (ALD) and to a low energy radical-based ALD, and reactive to high energy ions for breaking up the capping molecule of the capping compound.

10. A method comprising:
    selectively growing a trench material within a trench of a semiconductor device using a plurality of successive cycles, each of the plurality of successive cycles including:
      chemisorbing a precursor along a set of surfaces of the trench;
      reacting the precursor with a capping compound to form a capping layer along the set of surfaces of the trench; and
      performing an ion implant to the semiconductor device to activate just a portion of the capping layer by breaking up a capping molecule of the capping compound.

11. The method according to claim 10, the portion of the capping layer disposed along a bottom surface of the trench and along a top surface of the semiconductor device.

12. The method according to claim 11, further comprising implanting ions into the portion of the capping layer disposed along the bottom surface of the trench at an angle substantially perpendicular to the bottom surface of the trench.

13. The method according to claim 11, the portion of the capping layer disposed along an upper portion of a sidewall of the trench.

14. The method according to claim 13, further comprising implanting ions into the portion of the capping layer along the upper portion of the sidewall of the trench at an angle substantially non-parallel to the sidewall of the trench and non-parallel to the bottom surface of the trench.

15. The method according to claim 14, further comprising removing the capping layer along the bottom surface of the trench and a bottom portion of the sidewall of the trench.

16. The method according to claim 10, wherein the capping compound is ethylenediamine, the precursor is silicon tetrabromide, and the trench material is silicon nitride.

17. A method comprising:
    selectively growing a trench-fill material within a trench of a semiconductor device by performing a plurality of successive cycles, each of the plurality of successive cycles including:
      chemisorbing a precursor conformally along a set of surfaces of the trench;
      reacting the precursor with a capping compound to form a capping layer along the set of surfaces of the trench; and performing an ion implant to the semiconductor device to activate just a portion of the capping layer by breaking up a capping molecule of the capping compound.

18. The method according to claim 17, further comprising implanting ions into the portion of the capping layer, disposed along a bottom surface of the trench, at an angle substantially perpendicular to the bottom surface of the trench.

19. The method according to claim 18, further comprising implanting ions into the portion of the capping layer, disposed along an upper portion of a sidewall of the trench, at an angle substantially non-parallel to the sidewall of the trench and non-parallel to the bottom surface of the trench.

* * * * *